US009496304B2

United States Patent
Hu et al.

(10) Patent No.: US 9,496,304 B2
(45) Date of Patent: *Nov. 15, 2016

(54) IMAGE SENSOR PIXEL CELL WITH SWITCHED DEEP TRENCH ISOLATION STRUCTURE

(71) Applicant: OMNIVISION TECHNOLOGIES, INC., Santa Clara, CA (US)

(72) Inventors: Sing-Chung Hu, San Jose, CA (US); Rongsheng Yang, San Jose, CA (US); Gang Chen, San Jose, CA (US); Howard E. Rhodes, Nokomis, FL (US); Sohei Manabe, San Jose, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/704,493

(22) Filed: May 5, 2015

(65) Prior Publication Data

US 2015/0236058 A1    Aug. 20, 2015

Related U.S. Application Data

(63) Continuation-in-part of application No. 13/968,210, filed on Aug. 15, 2013, now Pat. No. 9,054,007.

(51) Int. Cl.
| | |
|---|---|
| *H01L 29/66* | (2006.01) |
| *H01L 27/146* | (2006.01) |
| *H04N 5/378* | (2011.01) |

(52) U.S. Cl.
CPC ..... *H01L 27/1463* (2013.01); *H01L 27/14607* (2013.01); *H01L 27/14612* (2013.01); *H01L 27/14643* (2013.01); *H04N 5/378* (2013.01)

(58) Field of Classification Search
CPC ............. H01L 27/1463; H01L 27/14643
USPC ............... 257/233, 239; 250/208.1
See application file for complete search history.

(56) References Cited

U.S. PATENT DOCUMENTS

| | | | |
|---|---|---|---|
| 7,838,956 B2 | 11/2010 | McCarten et al. | |
| 8,138,531 B2 | 3/2012 | Adkisson et al. | |

(Continued)

FOREIGN PATENT DOCUMENTS

| | | |
|---|---|---|
| TW | 200810540 A | 2/2008 |
| TW | 201138079 A | 11/2011 |
| TW | 201324753 A | 6/2013 |

OTHER PUBLICATIONS

"Applied Materials Introduces Deep Trench Etch Technology for Sub-100 Nanometer DRAM Manufacturing." *The Free Library* Jul. 13, 2001, 2 pages. Accessed Aug. 15, 2013 from <http://www.thefreelibrary.com/Applied Materials Introduces Deep Trench Etch Technology for Sub-100 . . . -a076515906>.

*Primary Examiner* — Long K Tran
(74) *Attorney, Agent, or Firm* — Blakely Sokoloff Taylor & Zafman LLP

(57) ABSTRACT

A pixel cell includes a photodiode disposed in an epitaxial layer in a first region of semiconductor material to accumulate image charge. A floating diffusion is disposed in a well region disposed in the epitaxial layer in the first region. A transfer transistor is coupled to selectively transfer the image charge from the photodiode to the floating diffusion. A deep trench isolation (DTI) structure disposed in the semiconductor material. The DTI structure isolates the first region of the semiconductor material on one side of the DTI structure from a second region of the semiconductor material on an other side of the DTI structure. The DTI structure includes a doped semiconductor material disposed inside the DTI structure that is selectively coupled to a readout pulse voltage in response to the transfer transistor selectively transferring the image charge from the photodiode to the floating diffusion.

32 Claims, 4 Drawing Sheets

(56) References Cited

U.S. PATENT DOCUMENTS

| | | | |
|---|---|---|---|
| 8,390,089 B2* | 3/2013 | Chen | H01L 27/1464 |
| | | | 257/447 |
| 8,704,282 B2* | 4/2014 | Marty | H01L 27/1463 |
| | | | 257/292 |
| 8,937,272 B2 | 1/2015 | Hynecek | |
| 9,054,007 B2* | 6/2015 | Hu | H01L 27/14643 |
| 2007/0252731 A1* | 11/2007 | Chung | H01L 21/761 |
| | | | 341/50 |
| 2008/0265348 A1 | 10/2008 | Maas et al. | |
| 2010/0148289 A1 | 6/2010 | McCarten et al. | |
| 2010/0230729 A1 | 9/2010 | Ellis-Monaghan et al. | |
| 2010/0279459 A1 | 11/2010 | Huang et al. | |
| 2012/0025199 A1* | 2/2012 | Chen | H01L 27/1464 |
| | | | 257/75 |
| 2013/0320407 A1 | 12/2013 | Ahn | |
| 2014/0016012 A1 | 1/2014 | Oishi | |
| 2014/0291481 A1 | 10/2014 | Zhang et al. | |
| 2015/0048427 A1 | 2/2015 | Hu et al. | |

* cited by examiner

IMAGE SENSOR PIXEL CELL WITH SWITCHED DEEP TRENCH ISOLATION STRUCTURE

RELATED APPLICATION

This application is a continuation-in-part of co-pending U.S. patent application Ser. No. 13/968,210 of Hu et al., filed Aug. 15, 2013, entitled "Image Sensor Pixel Cell With Switched Deep Trench Isolation Structure," and assigned to the Assignee of the present application.

BACKGROUND INFORMATION

1. Field of the Disclosure

The present invention relates generally semiconductor processing. More specifically, examples of the present invention are related to semiconductor processing of image sensor pixel cells.

2. Background

An image capture device includes an image sensor and an imaging lens. The imaging lens focuses light onto the image sensor to form an image, and the image sensor converts the light into electric signals. The electric signals are output from the image capture device to other components of a host electronic system. The electronic system may be, for example, a mobile phone, a computer, a digital camera or a medical device.

There is a continuing demand to reduce the size of image sensors, which results in the smaller pixel cells for an image sensor with the same resolution. As the sizes of pixel cells continue to decease, the issue of pixel cell crosstalk and unwanted signal transfer between pixel cells continues to become a growing challenge. Furthermore, as image sensors are miniaturized, the pixel cells contained therein suffer from increased dark current rates.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
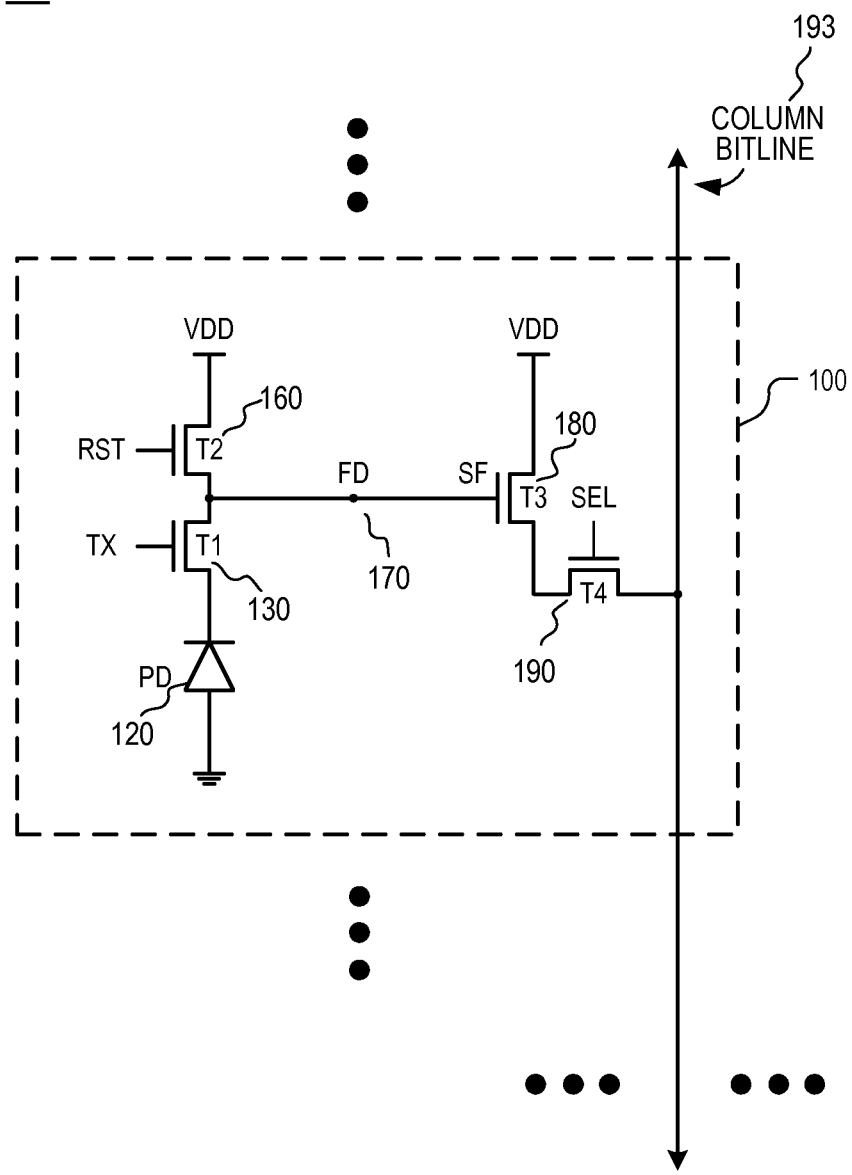
FIG. 1 is a schematic illustrating one example of pixel cell that may be included in an example image sensor having switched deep trench isolation structures in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Examples in accordance with the teaching of the present invention describe a pixel cell with switched deep trench isolation structures in accordance with the teachings of the present invention. In one example, the switched deep trench isolation structures are biased capacitive type isolation structures. As will be shown, in various examples, pixel cells in accordance with the teachings of the present invention utilize switched and biased deep trench isolation structures, which reduce pixel crosstalk and also achieve higher fill factor by featuring a moderately doped N type epitaxial region between the switched deep trench isolation structures. Thus, in the examples, no P type doped regions are required to line the isolation structures and consume space in the photodiode region where light falls. Since the P type doped regions are not needed to line the isolation structures, increased full well capacity is realized in accordance with the teachings of the present invention. Furthermore, as will be shown, by switching the deep trench isolation structures in various examples with a negative readout pulse voltage in accordance with the teachings of the present invention, lag time is reduced because the image charge is pushed out of the photodiode to the floating diffusion of the pixel cell once the transfer of image charge begins.

To illustrate, FIG. 1 is a schematic illustrating one example of pixel cell 100 that may be one of a plurality of pixel cells that are arranged in an example pixel array 192 having switched deep trench isolation structures in accordance with the teachings of the present invention. In the depicted example, pixel cell 100 is illustrated as being a four-transistor ("4T") pixel cell included in a backside illuminated image sensor in accordance with the teachings of the invention. It is appreciated that pixel cell 100 is one possible example of pixel circuitry architecture for implementing each pixel cell within pixel array 192 of FIG. 1. However, it should be appreciated that other examples in accordance with the teachings of the present invention are not necessarily limited to 4T pixel architectures. One having ordinary skill in the art having the benefit of the present disclosure will understand that the present teachings are also applicable to 3T designs, 5T designs, and various other pixel architectures in accordance with the teachings of the present invention.

In the example depicted in FIG. 1, pixel cell 100 includes a photodiode ("PD") 120 to accumulate image charge, a transfer transistor T1 130, a reset transistor T2 160, a floating diffusion ("FD") 170, a source-follower ("SF") transistor T3 180, and a select transistor T4 190. During operation, transfer transistor T1 130 receives a transfer signal TX, which transfers the image charge accumulated in photodiode PD 120 to floating diffusion FD 170. In one example, floating diffusion FD 170 may be coupled to a storage capacitor for temporarily storing image charges. In one example and as will be discussed in further detail below, a deep trench isolation structure (shown below in FIG. 2) is included in pixel cell 100 and is selectively coupled to a readout pulse voltage to reduce image lag in response to the transfer transistor T1 130 selectively transferring the image charge from the photodiode PD 120 to the floating diffusion FD 170 in response to the transfer signal TX in accordance with the teachings of the present invention.

As shown in the illustrated example, reset transistor T2 160 is coupled between a power rail VDD and the floating diffusion FD 170 to reset the pixel cell 100 (e.g., discharge or charge the floating diffusion FD 170 and the photodiode PD 120 to a preset voltage) in response to a reset signal RST. The floating diffusion FD 170 is coupled to control the gate of SF transistor T3. SF transistor T3 is coupled between the power rail VDD and select transistor T4. SF transistor T3 operates as a source-follower amplifier providing a high impedance connection to the floating diffusion FD 170. Select transistor T4 190 selectively couples the output of pixel cell 100 to the readout column bitline 193 in response to a select signal SEL.

In one example, the TX signal, the RST signal, the SEL signal, and the readout pulse voltage, which is selectively coupled to the deep trench isolation, are generated by control circuitry, an example of which will be described in further detail below. In an example in which pixel array 192 operates with a global shutter, the global shutter signal is coupled to the gate of each transfer transistor T1 130 in the pixel array 192 to simultaneously commence charge transfer from each pixel's photodiode PD 120. Alternatively, rolling shutter signals may be applied to groups of transfer transistors T1 130 in accordance with the teachings of the present invention.

Figure 2:
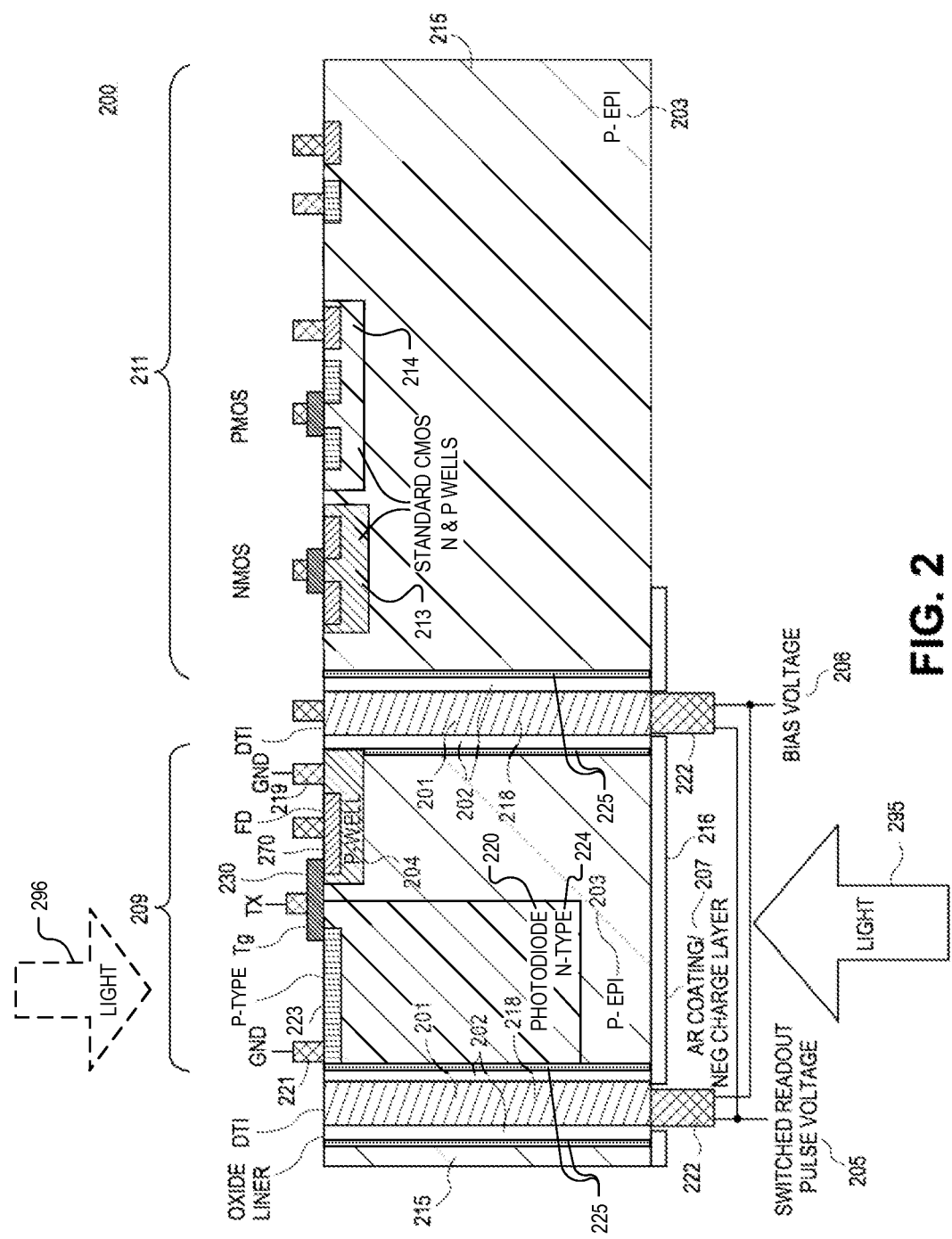
FIG. 2 is a cross-section view illustrating one example of pixel cell having switched deep trench isolation structures in accordance with the teachings of the present invention.

FIG. 2 is a cross-section view illustrating one example of pixel cell 200 having switched deep trench isolation structures 201 in accordance with the teachings of the present invention. In one example, it is noted that example pixel cell 200 of FIG. 2 is a cross-section view of the example pixel cell 100 of FIG. 1, and it should be appreciated that similarly named and numbered elements referenced below are coupled and function as described above. As shown in the depicted example, pixel cell 200 includes a photodiode 220 that includes a P-type doped region 223 disposed in an N-type doped region 224 disposed in an epitaxial layer 203 to accumulate image charge in response to light 295. In the illustrated example, epitaxial region 203 is moderately doped with P-type dopants. It is appreciated in another example that that the polarities of the dopants could be reversed. In other words, photodiode 220 includes a doped region 223 having dopants of a first polarity, disposed in a doped region 224 having dopants of a second polarity, disposed in an epitaxial layer 203 having dopants of the first polarity, such that there is a PN junction at the interface between doped region 223 and doped region 224. In one example, photodiode 220 is a partially pinned photo diode and is coupled to a ground reference voltage GND through a contact 221 as shown. As shown in the depicted example, photodiode 220 is disposed in a first region 209 of semiconductor material 215. In one example, first region 209 includes the pixel circuitry of the pixel cell 200.

In one example, a backside 216 of semiconductor material 215 is illuminated with light 295. As a result, light 295 is directed through backside 216 of semiconductor material 215 to photogenerate the image charge in photodiode 220. Accordingly, in the illustrated example, an antireflective ("AR") coating/negative charge layer 207 is disposed on the backside 216 surface of the semiconductor material 215. In another example, it is appreciated that light 296 may be directed through a front side of semiconductor material 215 to generate image charge in a front side illuminated photodiode in accordance with the teachings of the present invention.

Continuing with the example depicted in FIG. 2, pixel cell 200 also includes a floating diffusion FD 270 disposed in a well region 204, which is disposed in the epitaxial layer 203 in the first region 209 of the semiconductor material 215 as shown. In the illustrated example, the well region 204 in which floating diffusion FD 270 is disposed includes P type dopants. In one example, the well region 204 has a higher doping concentration than epitaxial layer 203. In the example, well region 204 is also coupled to the ground reference voltage GND through a contact 219 as shown. As such, epitaxial layer 203 and floating diffusion FD 270 are coupled to ground reference voltage GND contact 219. In the example, pixel cell 200 also includes a transfer transistor 230 disposed in the first region 209 of the semiconductor material 215 and is coupled between the photodiode 220 and the floating diffusion FD 270. As shown in the example, transfer transistor 230 includes a transfer gate Tg and is coupled to selectively transfer the image charge accumulated in the photodiode 220 to the floating diffusion FD 270 in response to a transfer signal TX in accordance with the teachings of the present invention.

As shown in FIG. 2, pixel cell 200 also includes one or more deep trench isolation (DTI) structures 201, which are disposed in the semiconductor material 215. In one example, the one or more DTI structures 201 extend all the way to the backside 216 surface of semiconductor material 215 as shown. Thus, as shown in the depicted example, the one or more DTI structures 201 isolate the first region 209 of the semiconductor material 215 on one side of the DTI structure 201 from one or more other regions, such as for example second region 211 of the semiconductor material 215, on the other side of the DTI structure 201. In one example, the second region 211 includes periphery circuitry of the pixel cell 200. In the depicted example, the periphery circuitry in the second region 211 of the pixel cell 200 includes standard CMOS circuitry including standard CMOS N and P wells 213 and 214 disposed in epitaxial layer 203 of semiconductor material 215 as shown. In one example, the epitaxial layer 203 in the second region 211 is doped with the same polarity dopants as the epitaxial layer 203 in the first region 209. In particular, as shown in the example depicted in FIG. 2, epitaxial layer 203 in the second region 211 is also moderately doped with P-type dopants.

In one example, each of the one or more DTI structures 201 is a capacitive type isolation structure that includes a dielectric layer 202 lining an inside surface of each of the one or more DTI structures 201. In one example, the dielectric layer is an oxide layer, including for example silicon dioxide, having a thickness of approximately 100 Angstroms. Each of the one or more DTI structures 201 further includes doped semiconductor material 218 disposed over the dielectric layer 202 inside the DTI structure 201. In one example, each of the one or more DTI structures 201 also includes a P doped region 225 lining the surface of the epitaxial layer 203 at its interface with the dielectric layer 202 lining the inside surface of the DTI structures 201. In the depicted example, the doped semiconductor material 218 disposed inside each of the one or more DTI structures 201 is selectively coupled to a readout pulse voltage 205 through contacts 222 in response to the transfer transistor 230 selectively transferring the image charge accumulated in the photodiode 220 to the floating diffusion FD 270 in response to the transfer signal TX in accordance with the teachings of the present invention. In one example, the doped semiconductor material 218 disposed inside each of the one or more DTI structures 201 is lightly doped polysilicon including P type dopants such that the built in work function difference between the P type doped semiconductor material 218 and the P type doped epitaxial layer 203 of photodiode 220 creates an electric field favorable to reduce dark current in pixel cell 200. In one example, contacts 222 are metal contacts that are optional metal grid contacts to the doped semiconductor material 218 that are disposed on the backside 216 of semiconductor material 215 as shown.

In the example depicted in FIG. 2, the switched readout pulse voltage 205 is a negative voltage pulse that is applied during the readout sequence of the image charge from photodiode 220 to the floating diffusion FD 270 through transfer transistor 230 to reduce image lag. In the example, the switched readout pulse voltage 205 is then selectively decoupled from the doped semiconductor material 218 after the image charge has been transferred from the photodiode 220 to the floating diffusion FD 270 through the transfer transistor 230. In one example, a bias voltage 206 is coupled to the doped semiconductor material 218 through contacts 222 when the switched readout pulse voltage 205 is not applied. In one example, the bias voltage 206 is a negative bias that to generates a field in the pixel cell 200 to reduce dark current in the pixel cell 200. In one example, the negative bias voltage 206 has a magnitude that is less than a magnitude of the switched readout pulse voltage 205.

Figure 3:
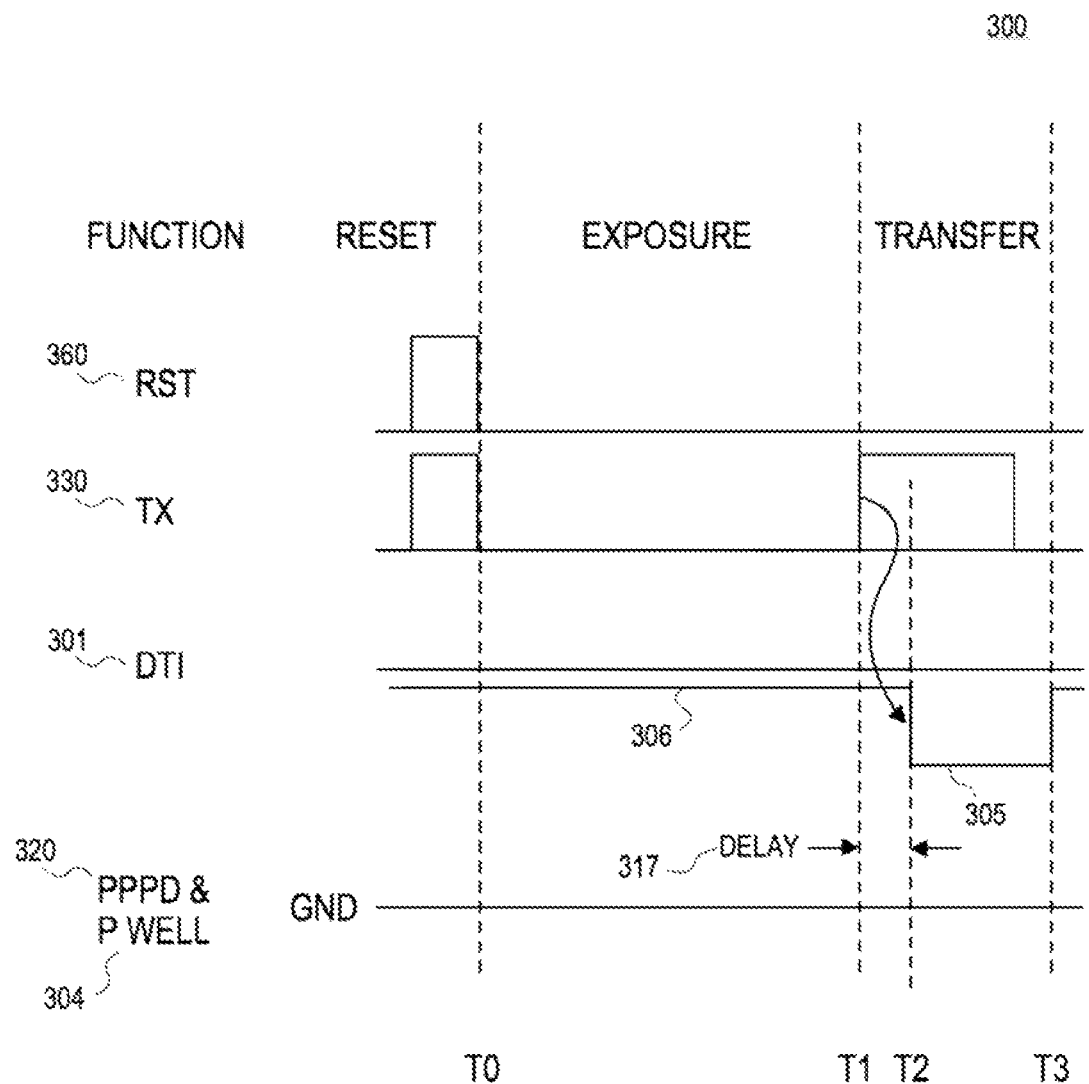
FIG. 3 illustrates a timing diagram of signals in an example pixel cell having switched deep trench isolation structures in accordance with the teachings of the present invention.

FIG. 3 illustrates a timing diagram 300 of example signals in example pixel cell 100 of FIG. 1 and/or in example pixel cell 200 of FIG. 2, which have switched deep trench isolation structures in accordance with the teachings of the present invention. As illustrated in the depicted example, timing diagram 300 shows that prior to time T0, a reset function occurs in which the reset signal RST 360 is applied to for example the gate terminal of reset transistor T2 160 of FIG. 1, and that the transmit signal TX 330 is applied to for example the gate terminal of transfer transistor T1 130 of FIG. 1, which is also illustrated as gate terminal Tg of transfer transistor 230 of FIG. 2. During this reset period prior to time T0 in FIG. 3, the voltage at floating diffusion FD 170 and photodiode PD 120 of FIG. 1, or the floating diffusion FD 270 and photodiode 220 of FIG. 2, are reset to the power rail VDD voltage, which discharges or charges the floating diffusion FD 170 and the photodiode PD 120 to a preset voltage.

FIG. 3 illustrates that after the reset function is completed at time T0, the photodiode is illuminated with light during an exposure period between time T0 and T1 to accumulate image charge in the photodiode, which is illustrated for example in FIG. 2 with light 295 being directed to photodiode 220 through backside 216 of semiconductor material 215. As shown for example in FIG. 3 during the exposure period between time T0 and T1, the DTI structure 301 is coupled to receive a negative bias signal 306, which in one example helps to generate an electric field in the pixel cell to reduce dark current in the pixel cell.

FIG. 3 shows that after the exposure function is completed at time T1, the image charge accumulated in the photodiode is then transferred from the photodiode through the transfer transistor to the floating diffusion during the transfer function between time T1 and T3. FIG. 3 shows that this process begins with the transfer transistor signal TX 330 being applied to turn on the transfer transistor, such as for example transfer transistor 130 of FIG. 1, or transfer transistor 230 of FIG. 2. In one example, after a time delay from T1 to T2, the DTI structure, such as for example DTI structure 201 of FIG. 2, is coupled to receive a negative readout pulse voltage 305 as shown in FIG. 3 in response to the transfer transistor signal TX 330 selectively transferring the image charge from the photodiode to the floating diffusion. In one example, the time delay between time T1 and T2 is greater than or equal to zero. In one example, the negative pulse of the readout pulse voltage 305 during the readout sequence of the image charge from the photodiode 220 reduces image lag in accordance with the teachings of the present invention as the electric field created with the negative pulse of the readout pulse voltage 305 helps to push the image charge accumulated in the photodiode 220 to the floating diffusion FD 270 through the transfer transistor 230 in accordance with the teachings of the present invention. In the example, after the transfer function is completed at time T3, the DTI structure is then selectively decoupled from the readout pulse voltage 305, and the negative bias voltage 306 is once again applied to the DTI structure.

FIG. 3 also illustrates that the partially pinned photodiode and P well of the pixel cell, which may correspond to the partially pinned photodiode 220 and P well 204 as illustrated in FIG. 2, are coupled to a ground reference voltage GND through contacts 221 and 219. In one example, since partially pinned photodiode 220 and P well 204 are tied to the ground reference voltage GND as shown for example in FIG. 2, the threshold voltage of the transfer transistor 230 does not bounce around when the DTI structure 201 is coupled to selectively receive the negative readout pulse voltage 305 and couples the noise into the N epitaxial layer 203 side of the photodiode 220.

Figure 4:
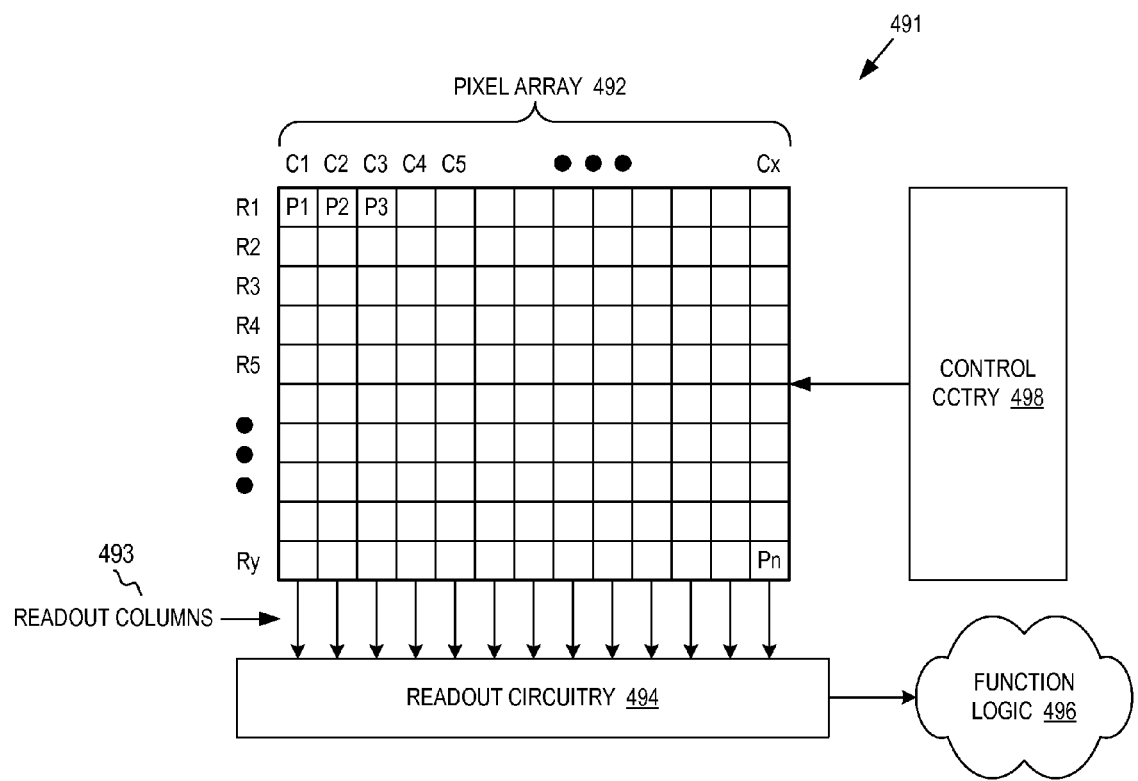
FIG. 4 is a diagram illustrating one example of an imaging system including a pixel array having pixel cells with switched deep trench isolation structures in accordance with the teachings of the present invention.

FIG. 4 is a diagram illustrating one example of an imaging system 491 including a pixel array 492 having pixel cells with switched deep trench isolation structures in accordance with the teachings of the present invention. As shown in the depicted example, imaging system 491 includes pixel array 492 coupled to control circuitry 498 and readout circuitry 494, which is coupled to function logic 496.

In one example, pixel array 492 is a two-dimensional (2D) array of imaging sensors or pixel cells (e.g., pixel cells P1, P2 . . ., Pn). In one example, each pixel cell is a CMOS imaging pixel. It is noted that the pixel cells P1, P2, . . . Pn in the pixel array 492 may be examples of pixel cell 100 of FIG. 1 and/or of pixel cell 200 of FIG. 2 and that similarly named and numbered elements referenced below are coupled and function similar to as described above. As illustrated, each pixel cell is arranged into a row (e.g., rows R1 to Ry) and a column (e.g., column C1 to Cx) to acquire image data of a person, place, object, etc., which can then be used to render a 2D image of the person, place, object, etc.

In one example, after each pixel cell has accumulated its image data or image charge, the image data is readout by readout circuitry 494 through readout column bitlines 493 and then transferred to function logic 496. In various examples, readout circuitry 494 may include amplification circuitry, analog-to-digital (ADC) conversion circuitry, or otherwise. Function logic 496 may simply store the image data or even manipulate the image data by applying post image effects (e.g., crop, rotate, remove red eye, adjust brightness, adjust contrast, or otherwise). In one example, readout circuitry 494 may readout a row of image data at a time along readout column bitlines 493 (illustrated) or may readout the image data using a variety of other techniques (not illustrated), such as a serial readout or a full parallel readout of all pixels simultaneously.

In one example, control circuitry 498 is coupled to pixel array 492 to control operational characteristics of pixel array 492. For example, control circuitry 498 may generate a shutter signal for controlling image acquisition. In one example, the shutter signal is a global shutter signal for simultaneously enabling all pixels within pixel array 492 to simultaneously capture their respective image data during a single acquisition window. In another example, the shutter signal is a rolling shutter signal such that each row, column, or group of pixels is sequentially enabled during consecutive acquisition windows.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel cell, comprising:
   a photodiode disposed in an epitaxial layer in a first region of semiconductor material to accumulate image charge;
   a floating diffusion disposed in a well region disposed in the epitaxial layer in the first region of the semiconductor material;
   a transfer transistor disposed in the first region of the semiconductor material and coupled between the photodiode and the floating diffusion to selectively transfer the image charge from the photodiode to the floating diffusion; and
   a deep trench isolation (DTI) structure disposed in the semiconductor material, wherein the DTI structure isolates the first region of the semiconductor material on one side of the DTI structure from a second region of the semiconductor material on an other side of the DTI structure, wherein the DTI structure includes a doped semiconductor material disposed inside the DTI structure, wherein the doped semiconductor material disposed inside the DTI structure is selectively coupled to a readout pulse voltage in response to the transfer transistor selectively transferring the image charge from the photodiode to the floating diffusion.

2. The pixel cell of claim 1 wherein the photodiode includes a first doped region having dopants of a first polarity, disposed in a second doped region having dopants of a second polarity, disposed in the epitaxial layer having dopants of the first polarity, in the first region of semiconductor material, and wherein the DTI structure further includes a dielectric layer lining an inside surface of the DTI structure.

3. The pixel cell of claim 2 wherein the doped semiconductor material disposed inside the DTI structure is selectively coupled to the readout pulse voltage as the image charge is transferred from the photodiode to the floating diffusion through the transfer transistor to reduce image lag.

4. The pixel cell of claim 2 wherein the doped semiconductor material disposed inside the DTI structure is selectively coupled to the readout pulse voltage after a delay time after the transistor is selectively switched to transfer the image charge from the photodiode to the floating diffusion.

5. The pixel cell of claim 2 wherein the doped semiconductor material disposed inside the DTI structure is selectively decoupled from the readout pulse voltage after the image charge has been transferred from the photodiode to the floating diffusion through the transfer transistor.

6. The pixel cell of claim 2 wherein the readout pulse voltage is a negative pulse voltage that is selectively coupled to the doped semiconductor material disposed inside the DTI structure in response to the transfer transistor selectively transferring the image charge from the photodiode to the floating diffusion.

7. The pixel cell of claim 2 wherein the doped semiconductor material disposed inside the DTI structure is coupled to a negative bias voltage to generate a field in the pixel cell to reduce dark current in the pixel cell, wherein the negative bias voltage has a magnitude that is less than a magnitude of the readout pulse voltage.

8. The pixel cell of claim 2 wherein the epitaxial layer and the well region in which the floating diffusion is disposed are coupled to a ground reference voltage.

9. The pixel cell of claim 2 further comprising a metal grid contact coupled to the doped semiconductor material disposed inside the DTI structure.

10. The pixel cell of claim 2 wherein the epitaxial layer in the first region of the semiconductor material is a P-doped epitaxial layer and the well region disposed in the epitaxial layer in the first region of the semiconductor material is a P doped well region, wherein the P doped well region has a higher doping concentration than the P-doped epitaxial layer.

11. The pixel cell of claim 2 wherein the DTI structure includes a P doped region lining a surface of the epitaxial layer at an interface with the dielectric layer lining the inside surface of the DTI structure.

12. The pixel cell of claim 2 wherein the DTI structure extends to a backside surface of the semiconductor material.

13. The pixel cell of claim 2 wherein the pixel cell is adapted to be illuminated from a backside of the semiconductor material.

14. The pixel cell of claim 2 wherein the pixel cell is adapted to be illuminated from a front side of the semiconductor material.

15. The pixel cell of claim 2 wherein the dielectric layer lining the inside surface of the DTI structure includes silicon dioxide.

16. The pixel cell of claim 2 wherein the doped semiconductor material disposed inside the DTI structure includes lightly doped polysilicon.

17. An imaging system, comprising:
a pixel array having a plurality of pixel cells, wherein each one of the plurality of pixel cells includes:
  a photodiode disposed in an epitaxial layer in a first region of semiconductor material to accumulate image charge;
  a floating diffusion disposed in a well region disposed in the epitaxial layer in the first region of the semiconductor material;
  a transfer transistor disposed in the first region of the semiconductor material and coupled between the photodiode and the floating diffusion to selectively transfer the image charge from the photodiode to the floating diffusion; and
  a deep trench isolation (DTI) structure disposed in the semiconductor material, wherein the DTI structure isolates the first region of the semiconductor material on one side of the DTI structure from a second region of the semiconductor material on an other side of the DTI structure, wherein the DTI structure includes a doped semiconductor material disposed inside the DTI structure, wherein the doped semiconductor material disposed inside the DTI structure is selectively coupled to a readout pulse voltage in response to the transfer transistor selectively transferring the image charge from the photodiode to the floating diffusion;
control circuitry coupled to the pixel array to control operation of the pixel array; and
readout circuitry coupled to the pixel array to readout image data from the plurality of pixel cells.

18. The imaging system of claim 17 wherein the photodiode includes a first doped region having dopants of a first polarity, disposed in a second doped region having dopants of a second polarity, disposed in the epitaxial layer having dopants of the first polarity, in the first region of semiconductor material, and wherein the DTI structure further includes a dielectric layer lining an inside surface of the DTI structure.

19. The imaging system of claim 18 further comprising function logic coupled to the readout circuitry to store the image data readout from the plurality of pixel cells.

20. The imaging system of claim 18 wherein the doped semiconductor material disposed inside the DTI structure is selectively coupled to the readout pulse voltage as the image charge is transferred from the photodiode to the floating diffusion through the transfer transistor to reduce image lag.

21. The imaging system of claim 18 wherein the doped semiconductor material disposed inside the DTI structure is selectively coupled to the readout pulse voltage after a delay time after the transistor is selectively switched to transfer the image charge from the photodiode to the floating diffusion.

22. The imaging system of claim 18 wherein the doped semiconductor material disposed inside the DTI structure is selectively decoupled from the readout pulse voltage after the image charge has been transferred from the photodiode to the floating diffusion through the transfer transistor.

23. The imaging system of claim 18 wherein the readout pulse voltage is a negative pulse voltage that is selectively coupled to the doped semiconductor material disposed inside the DTI structure in response to the transfer transistor selectively transferring the image charge from the photodiode to the floating diffusion.

24. The imaging system of claim 18 wherein the doped semiconductor material disposed inside the DTI structure is coupled to a negative bias voltage to generate a field in the pixel cell to reduce dark current in the pixel cell, wherein the negative bias voltage has a magnitude that is less than a magnitude of the readout pulse voltage.

25. The imaging system of claim 18 wherein the epitaxial layer and the well region in which the floating diffusion is disposed are coupled to a ground reference voltage.

26. The imaging system of claim 18 further comprising a metal grid contact coupled to the doped semiconductor material disposed inside the DTI structure.

27. The imaging system of claim 18 wherein the epitaxial layer in the first region of the semiconductor material is a P-doped epitaxial layer and the well region disposed in the epitaxial layer in the first region of the semiconductor material is a P doped well region, wherein the P doped well has a higher doping concentration than the P-doped epitaxial layer.

28. The imaging system of claim 18 wherein the pixel cell is adapted to be illuminated from a front side of the semiconductor material.

29. The imaging system of claim 18 wherein the DTI structure extends to a backside surface of the semiconductor material.

30. The imaging system of claim 18 wherein the pixel cell is adapted to be illuminated from a backside of the semiconductor material.

31. The imaging system of claim 18 wherein the dielectric layer lining the inside surface of the DTI structure includes silicon dioxide.

32. The imaging system of claim 18 wherein the doped semiconductor material disposed inside the DTI structure includes lightly doped polysilicon.

\* \* \* \* \*